(12) United States Patent
Ryu et al.

(10) Patent No.: US 8,994,471 B2
(45) Date of Patent: Mar. 31, 2015

(54) STACKED DIODE LIMITER (71) Applicant: Electronics and Telecommunications Research Institute, Daejeon (KR)

(72) Inventors: Seung-Kab Ryu, Daejeon (KR); Kyung-Hoon Lee, Daejeon (KR); Kwang-Uk Chu, Daejeon (KR); Uijung Kim, Daejeon (KR); Up Namkoong, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 14/191,974

(22) Filed: Feb. 27, 2014

(65) Prior Publication Data
US 2015/0002238 A1 Jan. 1, 2015

(30) Foreign Application Priority Data
Jun. 27, 2013 (KR) ........................ 10-2013-0074674

(51) Int. Cl.
H03G 11/00 (2006.01)
H01P 1/00 (2006.01)
H01P 1/22 (2006.01)

(52) U.S. Cl.
CPC ................ H01P 1/005 (2013.01); H01P 1/222 (2013.01)
USPC .............................. 333/17.2; 333/33; 333/127

(58) Field of Classification Search
CPC .................................. H01P 1/005; H01P 1/222
USPC .............................. 333/17.2, 33, 127; 439/578
See application file for complete search history.

(56) References Cited

U.S. PATENT DOCUMENTS

| 4,044,357 | A | * | 8/1977 | Goldie | 342/200 |
| 4,122,418 | A | * | 10/1978 | Nagao | 333/219.1 |
| 4,917,630 | A | * | 4/1990 | Hubbard | 439/578 |
| 5,053,910 | A | * | 10/1991 | Goldstein | 361/111 |
| 6,447,333 | B1 | * | 9/2002 | Springer | 439/578 |
| 6,808,417 | B2 | * | 10/2004 | Yoshida | 439/585 |
| 6,853,264 | B2 | | 2/2005 | Bennett et al. | |
| 6,884,950 | B1 | * | 4/2005 | Nicholson et al. | 200/181 |
| 7,235,973 | B2 | * | 6/2007 | Chmielewski et al. | 324/318 |
| 7,385,456 | B2 | * | 6/2008 | Heston et al. | 333/17.2 |
| 2005/0047051 | A1 | | 3/2005 | Marland | |

FOREIGN PATENT DOCUMENTS

| GB | 2 202 683 A | 9/1988 |
| JP | 05-235677 A | 9/1993 |
| KR | 10-1995-0002748 B1 | 3/1995 |

* cited by examiner

Primary Examiner — Kenneth Wells
(74) Attorney, Agent, or Firm — LRK Patent Law Firm (57) ABSTRACT A stacked diode limiter, which can suppress and eliminate a malicious high-power electromagnetic pulse signal and an Intentional Electromagnetic Interference (IEMI) signal that are input to the antenna line of a wireless system and that include a communication service frequency component having a power of several kW or more, includes a stacked diode unit including one or more diode stack parts formed on a center electrode of a coaxial line formed between an input connector and an output connector, each diode stack part being configured such that a plurality of diodes are arranged in series and stacked on top of one another, and an impedance matching unit for configuring dielectrics between the connectors and the coaxial line as heterogeneous dielectrics and matching impedances between the connectors and the coaxial line.

13 Claims, 12 Drawing Sheets

STACKED DIODE LIMITER

CROSS REFERENCE TO RELATED APPLICATION

This application claims the benefit of Korean Patent Application No. 10-2033-0074674 filed on Jun. 27, 2033, which is hereby incorporated by reference in its entirety into this application.

BACKGROUND OF THE INVENTION

1. Technical Field

The present invention relates generally to a stacked diode limiter and, more particularly, to a stacked diode limiter, which reduces the power intensity of a high-power interference pulse input to an in-band communication frequency band, thus protecting an electronic device arranged at the subsequent stage of an antenna in a wireless system.

2. Description of the Related Art

In the case of an operating frequency band of a wireless communication system, only signals in a specific band are transmitted without loss by a filter at an input stage and frequency signals out of the band are sufficiently attenuated by the filter.

However, when an interference pulse signal source, the frequency band of which is identical to that of the in-band communication frequency band, or the frequency band of which includes a part of the corresponding frequency band and which has a peak power of several hundreds of W to several tens of kW, is input to a wireless communication system through the antenna, a semiconductor device (in particular, the transistor part of a low-noise amplifier) connected to the subsequent stage of the antenna may be physically damaged or may malfunction (or be disordered) at such a predetermined power intensity or more.

An interference signal flowing into an in-band communication frequency band cannot be eliminated using only a filtering method. In order to prevent such an interference signal, a limiter device capable of non-linearly suppressing signals according to the intensity of input power is required.

Generally, a modular limiter device used in the antenna line of a wireless communication system or the like has a structure in which surface-mount diodes (SMD) are assembled on a planar board, and is typically operated within the range of input power of several tens of W. If the input power of the modular limiter device increases to several kW or more, an interval between the signal line of a microstrip line and a bottom ground layer is decreased, thus causing an electrical breakdown phenomenon. Further, when discharge caused by the electrical breakdown is continued, the board may be burned out or the conductor of a signal line may be melted.

Therefore, in order to prevent high-power interference signals of several kW or more, a waveguide-type transmission line other than a microstrip line, a strip line, a fin line, or a coplanar waveguide line, which uses a planar board, must be used.

However, such a waveguide structure is also disadvantageous in that when the frequency is decreased below several hundreds of MHz to several GHz, the size of the aperture of the waveguide is increased, and then the arrangement of the waveguide-type transmission line in the system is limited.

Figure 1:
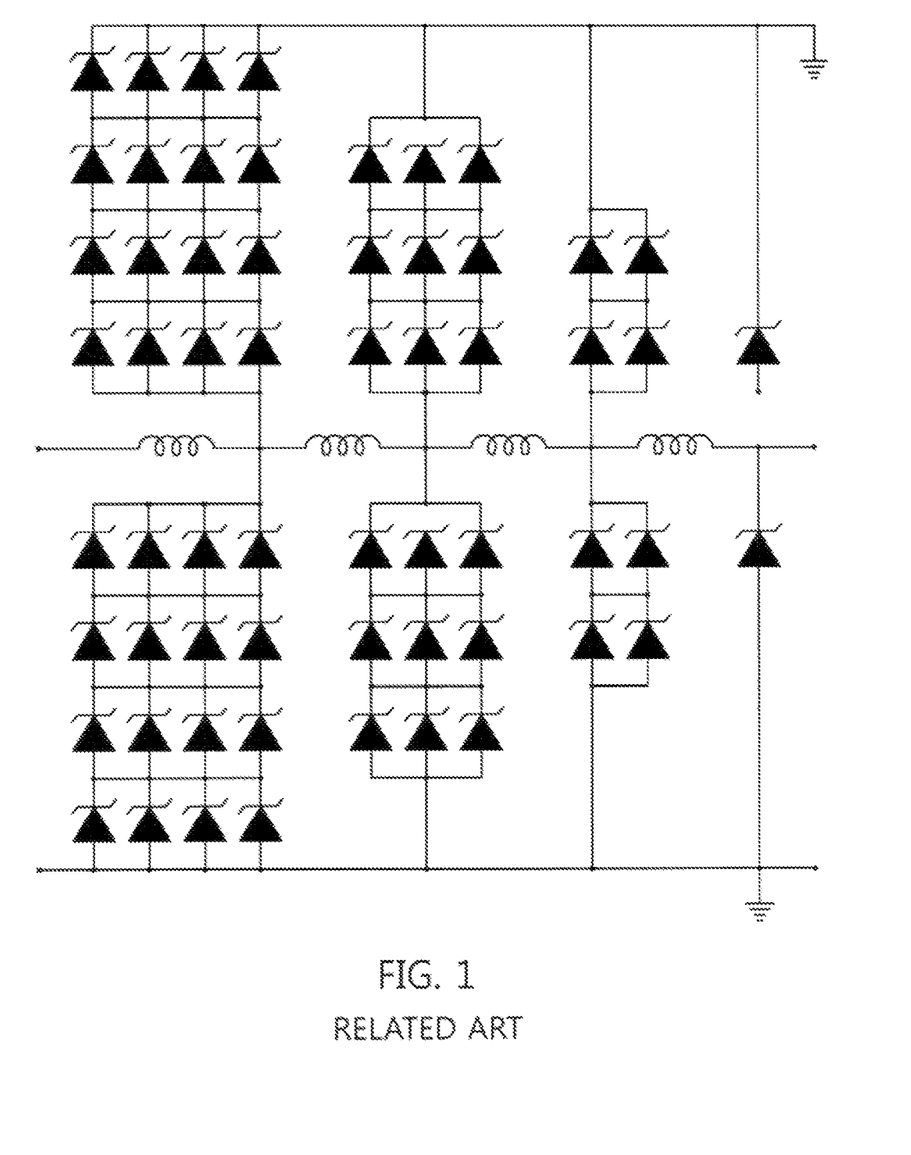
FIG. 1 is a diagram showing conventional technology.

Prior art related to this technology includes a power limiter used at the previous stage of a low-noise amplifier (LNA) manufactured using a GaAs process. Such technology is disclosed in U.S. Pat. No. 6,853,264 entitled "Input power limiter for a microwave receiver," in which multi-stage series/parallel diodes are assembled in different directions with respect to a transmission line, as shown in FIG. 1, thus improving power limitation performance. A structure in which elements are assembled on a transmission line in different directions is called an anti-parallel scheme, which denotes a scheme in which when diodes stacked on top of one another are connected to the upper and lower sides of a signal conductor for the transmission line, the anodes of the diodes are connected to one side of the transmission line signal conductor and the cathodes of the diodes are connected to the other side thereof, from the standpoint of the structure.

The structure of U.S. Pat. No. 6,853,264 is limited to the use of Schottky diodes without using PIN diodes typically used as limiter diodes. The reason for this is that it is impossible to integrate PIN diodes using the same process as that of a low-noise amplifier chip manufactured using a GaAs semiconductor process. Therefore, such a patent presents a scheme for utilizing Schottky diodes connected in series and in parallel to exhibit operating performance similar to that of PIN diodes even if the operating power characteristics thereof are not as good as the PIN diodes, thus improving operating power levels.

As shown in FIG. 1, technology disclosed in U.S. Pat. No. 6,853,264 presents a structure in which coarse limiters and fine limiters are arranged in a total of four stages in such a way that, in a first stage, 16 diodes are arranged in parallel and in series in a 4×4 array, in a second stage, 9 diodes are arranged in a 3×3 array, in a third stage, four diodes are arranged in a 2×2 array, and in a final stage, a single diode is connected. The diodes in all stages have an anti-parallel structure with respect to the transmission line, and the separation of individual stages is made using microstrip lines and inductors. In the design of a multi-stage limiter structure, a separation distance between individual stages must be a ¼ wavelength at the use frequency so as to prevent the impedances of the stages from influencing each other. In a semiconductor chip process, if ¼ wavelength is made using the length of only the microstrip line, the transmission line is excessively lengthened, so that the manufacture cost of chips is greatly increased, and thus inductors are employed as a method of compensating for an increase in the length of the line.

However, when such diodes are coupled to each other using inductors, high inductance occurs compared to the transmission line and high-frequency characteristics are limited, and thus there is a disadvantage in that a usable frequency band may be restricted.

Further, due to the operating power limits of Schottky diodes (having an input power limit of a total of 1 W or less) used for integration in a GaAs chip manufacturing process, even if a plurality of diodes are arranged in series and in parallel, the number of diodes that must be connected may reach several tens to several hundreds so as to operate even at pulse power of kW levels, thus greatly deviating from the original purpose of the limiter, that is, a previous stage protection circuit used in small-sized chips.

Further, a problem may arise in that, as the number of array diodes increases, the floating inductance and the floating capacitance of the circuit are continuously increased, and high-frequency impedance and insertion loss performance may be deteriorated, thus causing the use of the corresponding circuit to be greatly restricted.

SUMMARY OF THE INVENTION

Accordingly, the present invention has been made keeping in mind the above problems occurring in the prior art, and an object of the present invention is to provide a stacked diode limiter, which can suppress and eliminate a malicious high-power electromagnetic pulse signal and an Intentional Electromagnetic Interference (IEMI) signal that are input to the antenna line of a wireless system and that include a communication service frequency component having a power of several kW or more.

In accordance with an aspect of the present invention to accomplish the above object, there is provided a stacked diode limiter, including a stacked diode unit including one or more diode stack parts formed on a center electrode of a coaxial line formed between an input connecter and an output connector, each diode stack part being configured such that a plurality of diodes are arranged in series and stacked on top of one another; and an impedance matching unit for configuring dielectrics between the connectors and the coaxial line as heterogeneous dielectrics and matching impedances between the connectors and the coaxial line.

Preferably, the stacked diode unit may include a first diode stack part having two or more diodes staked on top of one another in series and formed on the center electrode of the coaxial line in an anti-parallel connection structure; and a second diode stack part having a single diode formed on the center electrode of the coaxial line to form an anti-parallel connection structure together with an opposite diode.

Preferably, operating power limits of the first diode stack part and the second diode stack part may be different from each other, and one of the first diode stack part and the second diode stack part, which has a higher operating power limit, may be arranged closer to the input connector.

Preferably, the first diode stack part and the second diode stack part may be arranged to be spaced apart from each other by a ¼ wavelength.

Preferably, the stacked diode unit may include a first diode stack part in which two or more diodes are stacked on top of one another in series and formed on the center electrode of the coaxial line in a single-ended connection structure; and a second diode stack part in which a single diode is formed on the center electrode of the coaxial line in a single-ended connection structure.

Preferably, the plurality of diodes may be connected via soldering or conductive epoxy, each diode stack part may be soldered at a second end of a connection part having threads formed at a first end thereof, and a threaded hole corresponding to the threads may be formed in the center electrode of the coaxial line, and the diode stack part may be formed on the center electrode of the coaxial line via threaded coupling between the threads and the threaded hole.

Preferably, the plurality of diodes may be implemented as PIN diodes.

Preferably, the center electrode of the coaxial line on which the stacked diode unit is formed may be protected by a housing, the stacked diode unit and the center electrode of the coaxial line are installed in a longitudinal hollow portion formed in the housing, and a first end of each diode stack part of the stacked diode unit comes into contact with the housing.

Preferably, the impedance matching unit may include a dielectric having a hollow and conical internal structure and a tapered structure; and a conductor inserted into the dielectric and configured to have a conical and tapered structure, wherein an outer circumferential surface of a first end of the conductor is spaced apart from an inner circumferential surface of the dielectric, an air layer may be formed in a separation space between the dielectric and the conductor, and first ends of the dielectric and the conductor may be connected to the input connector.

Preferably, the first ends of the dielectric and the conductor may be connected to the input connector to enclose a center electrode of the input connector.

Preferably, the stacked diode limiter may further include an inductor for bypassing a direct current (DC) voltage generated at both ends of each diode stack part when a power limiting operation is performed by the stacked diode unit.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED
EMBODIMENTS

Hereinafter, a stacked diode limiter according to embodiments of the present invention will be described in detail with reference to the attached drawings. Prior to the detailed description of the present invention, it should be noted that the terms or words used in the present specification and the accompanying claims should not be limitedly interpreted as having their common meanings or those found in dictionaries. Therefore, the embodiments described in the present specification and constructions shown in the drawings are only the most preferable embodiments of the present invention, and are not representative of the entire technical spirit of the present invention. Accordingly, It should be understood that various equivalents and modifications capable of replacing the embodiments and constructions of the present invention might be present at the time at which the present invention was filed.

Figure 2:
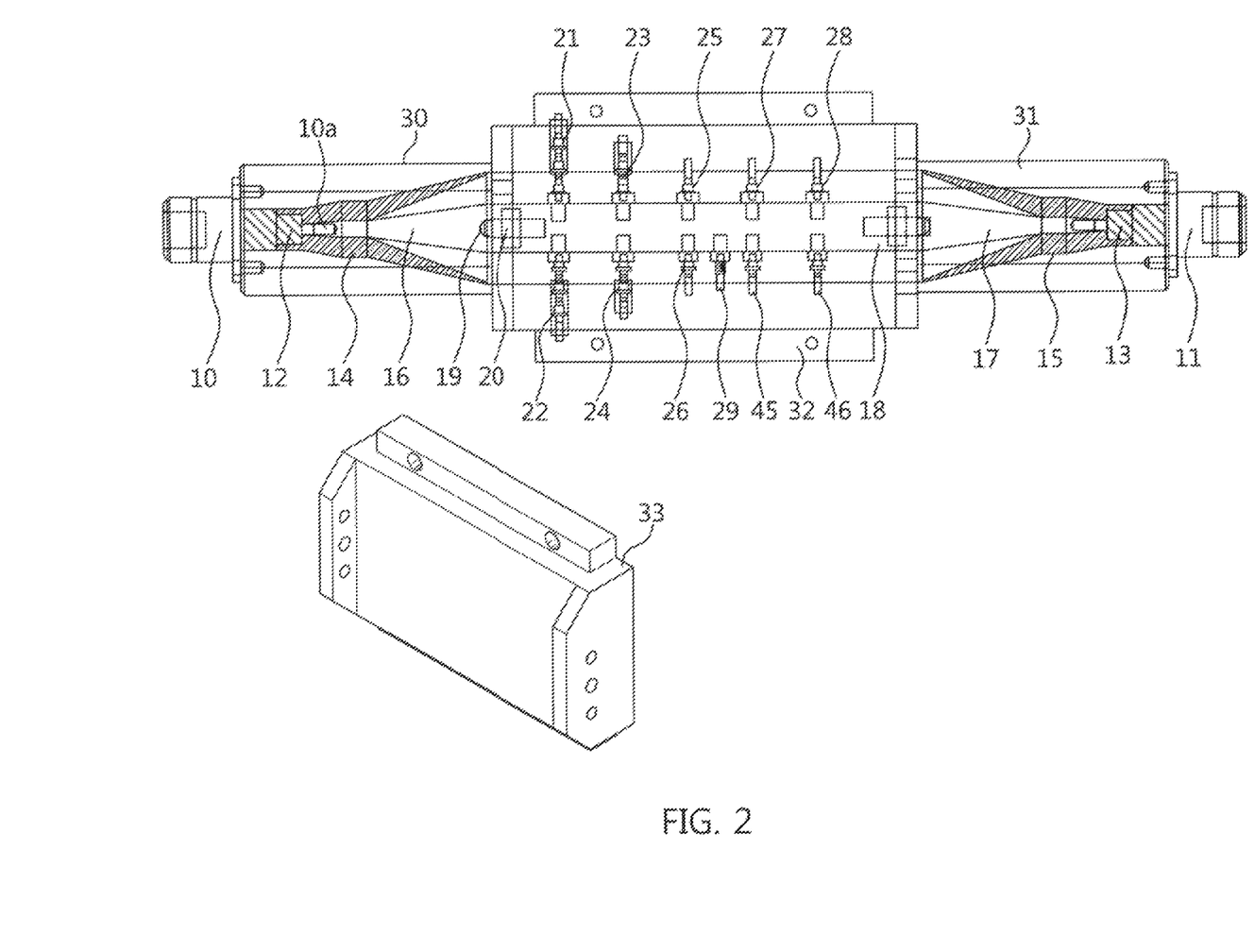
FIG. 2 is a diagram showing the configuration of a stacked diode limiter according to an embodiment of the present invention.
Figure 3:
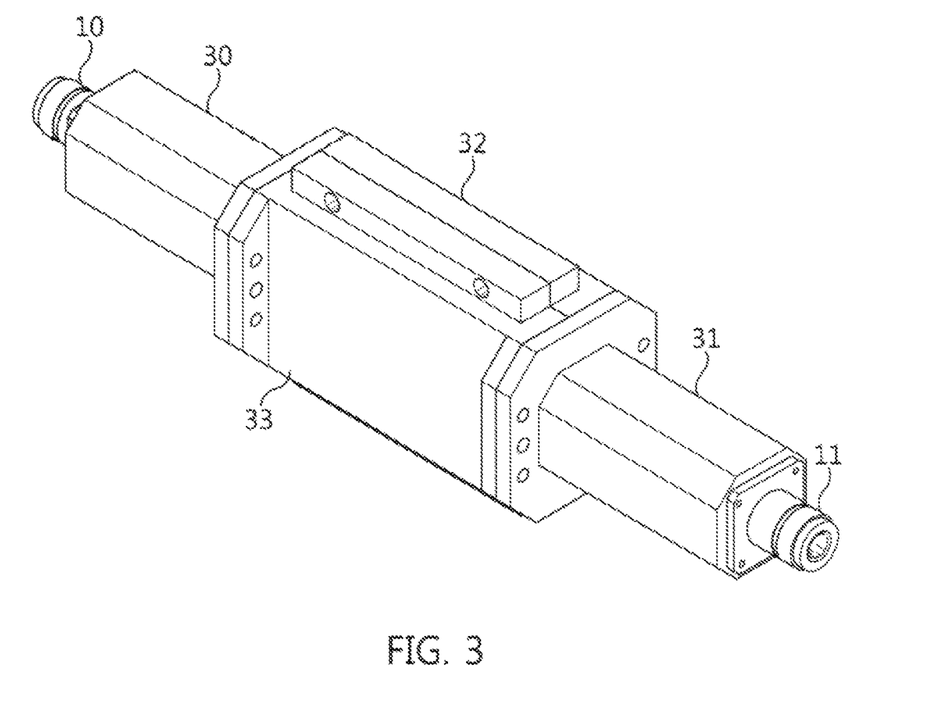
FIG. 3 is a perspective view showing the stacked diode limiter according to an embodiment of the present invention.
Figure 4:
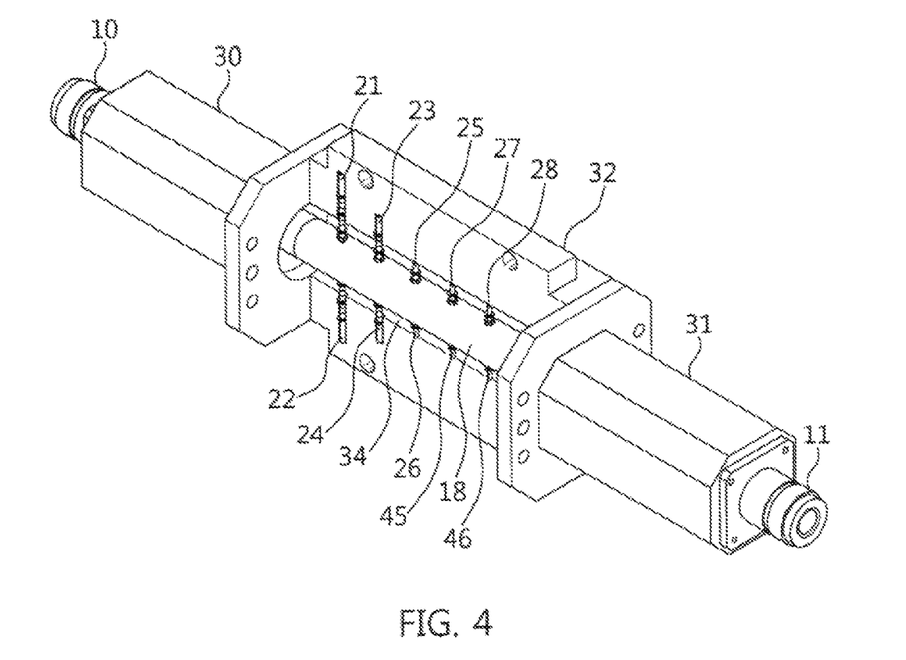
FIG. 4 is a diagram showing a state in which a housing cover is opened in FIG. 3.

FIG. 2 is a diagram showing the configuration of a stacked diode limiter according to an embodiment of the present invention, FIG. 3 is a perspective view showing the stacked diode limiter according to an embodiment of the present invention, and FIG. 4 is a diagram showing a state in which a housing cover is opened in FIG. 3.

The stacked diode limiter according to an embodiment of the present invention includes a stacked diode unit and an impedance matching unit.

The stacked diode unit is formed on the center electrode 18 of a transmission line formed between an input connector 10 and an output connector 11. The stacked diode unit may nonlinearly suppress signals depending on the intensity of input power. That is, the stacked diode unit may effectively suppress or eliminate high-power electromagnetic pulse signals that are input to the in-band communication frequency band of the corresponding wireless facility while having a peak power of several kW or more and having a frequency component of Direct Current (DC)-several GHz or less.

Here, the input connector 10 and the output connector 11 are commercial N-type connectors. Of course, if necessary, the input connector 10 may be the output connector, and the output connector 11 may be the input connector.

Further, the transmission line may be any one of a coaxial line, a microstrip line, a strip line, and a coplanar waveguide (CPW) line, but it is more preferable to use the coaxial line as the transmission line so as to suppress a high-power input pulse having a power of several kW or more.

The stacked diode unit includes first diode stack parts 21, 22, 23, and 24 in which two or more diodes are stacked on top of one another in series and are formed on the center electrode 18 of the transmission line in an anti-parallel connection structure; and second diode stack parts 25, 26, 27, 45, 28, and 46 in which a single diode is formed on the center electrode 18 of the transmission line to form an anti-parallel connection structure together with an opposite diode.

The stacked diode unit will be described in detail below. That is, the stacked diode unit is configured such that diodes are stacked on top of one another in series so as to overcome the input power limit of a single diode, thus extending the input power limit by the number of equivalently stacked diodes. The stacked diode unit includes diode stack parts 21 and 22 in which N diodes are arranged in series and stacked on top of one another and are connected to the center electrode 18 of the transmission line in the anti-parallel connection structure, diode stack parts 23 and 24 in which (N−1) diodes are stacked on top of one another in series while being spaced apart from the diode stack parts 21 and 22 by a predetermined interval, and are assembled in the same shape as that of the diode stack parts 21 and 22, and diode stack parts 25 and 26 in which a single diode is connected to the center electrode 18 of the transmission line to form the anti-parallel connection structure together with an opposite diode while being spaced apart from the adjacent diode stack parts by a predetermined interval. In this case, the number of diodes does not need to be sequential, like N, N−1, N−2, . . . , I, and the number of diodes to be stacked in a subsequent stage is determined depending on the suppression level of each diode stack part. In FIG. 2, the diode stack parts 27 and 45 and the diode stack parts 28 and 46 are diode stack parts in which a single diode is connected to the center electrode 18 of the transmission line to form the anti-parallel connection structure together with an opposite diode.

Each diode used in the stacked diode unit may be implemented as a diode having the maximum operating power in the corresponding frequency band among commercial PIN diodes. When the diode stack parts 25 and 26, each being implemented as a single diode, are N-th-stage sections, PIN diodes operating at medium power intensity or low power intensity may be configured in subsequent N+1-th-stage sections.

In other words, the stacked diode unit may be considered to be a structure in which different numbers of diodes to be stacked, having different input power limits, are periodically arranged at intervals of a predetermined length (¼ wavelength) calculated depending on the frequency in order to suppress or eliminate high-power pulse interference signals input to the in-band communication frequency band over multiple stages. In the stacked diode unit, a diode stack part having a high operating power limit may be considered to be arranged closer to the input connector.

Meanwhile, the center electrode 18 of the transmission line on which the stacked diode unit is formed is protected by a housing (ground electrode housing 32 and a housing cover 33). The center electrode 18 of the transmission line and the stacked diode unit are installed in a longitudinal hollow portion 34 formed in the housing (the ground electrode housing 32 and the housing cover 33). Here, one end of each diode stack part of the stacked diode unit comes into contact with the housing. In other words, this structure is formed in consideration of the case where the number of diode stacks connected to the center electrode 18 in parallel increases in the structure of the coaxial line forming the limiter, and the length of the center electrode becomes larger than the size of the internal space of the coaxial line, and then the diode stacks must be led in an external ground metal (that is, the ground electrode housing 32 and the housing cover 33). For this, in the external ground metal (that is, the ground electrode housing 32 and the housing cover 33), the hollow portion 34 is formed. Here, the separation distance to the diodes or the size of the hollow portion 34 must be determined not to deteriorate the frequency response characteristics of the coaxial line.

FIGS. 2 and 4 illustrate an example of a limiter in which diode stack parts are configured in a total of five stages, wherein three, two, one, one, and one diode(s) are stacked and arranged in respective stages and are assembled with the center electrode 18 of the coaxial line through threaded connection parts.

Impedance matching units connect the input connector 10 to the transmission line and connect the output connector 11 to the transmission line. In the impedance matching units, dielectrics between the connectors 10 and 11 and the transmission line are implemented as heterogeneous dielectrics, and then impedances between the connectors 10 and 11 and the transmission line are matched. In this case, the reason for determining that it is preferable to implement the impedance matching units using heterogeneous dielectrics is given as follows. When diodes are installed on the transmission line (for example, a coaxial line), if is difficult to install diodes when a dielectric (for example, Teflon) other than air is used. Accordingly, it is preferable to use the coaxial line having air as a dielectric so as to easily install the diodes, and thus the impedance matching units are implemented using heterogeneous dielectrics. Meanwhile, as the heterogeneous dielectrics are used, impedance mismatch between the heterogeneous dielectrics, that is, the Teflon dielectric of the N-type connector and the dielectric of the coaxial line having the air as a dielectric, may occur between the N-type connector and the coaxial line. In order to solve this problem, the embodiment of the present invention is configured such that impedance matching units (including elements 14 and 16 and elements 15 and 17) are implemented in a shape such as that shown in FIG. 2.

In FIG. 2, an inductor 29 bypasses a Direct Current (DC) voltage generated at both ends of each diode stack part (also regarded as "diodes") when a power limit operation is performed using the stacked diode unit.

In FIG. 2, reference numeral 12, not described, denotes a dielectric connected to the input connector 10, the dielectric being processed to be circumferentially stepped so as to improve insulation performance. Reference number 10a, not described, denotes the center electrode of the input connector 10. Reference numeral 13, not described, denotes a dielectric connected to the output connector 11, the dielectric being processed to be circumferentially stepped so as to improve insulation performance.

In FIG. 2, reference numeral 14, not described, denotes a dielectric having a conical internal structure and a tapered structure so as to connect the input connector 10 to the transmission line (for example, the coaxial line) and perform wideband impedance matching between heterogeneous dielectrics, that is, the dielectric 12 of the input connector 10 and the dielectric (air) of the coaxial line. Reference numeral 15, not described, denotes a dielectric having a conical internal structure and a tapered structure so as to connect the output connector 11 to the transmission line (for example, the coaxial line) and perform wideband impedance matching between heterogeneous dielectrics, that is, the dielectric 13 of the output connector 11 and the dielectric (air) of the coaxial line.

In FIG. 2, reference numerals 16 and 17, not described, denote conductors, each having a diameter which gradually increases at a predetermined rate by a specific length, so that the diameter of the center electrode 18 of the transmission line is varied to a diameter having a size sufficient to assemble diode stacks. The conductors 16 and 17 may be made of, for example, a brass material.

In FIG. 2, the dielectric 14 and the conductor 16 may be regarded as an impedance matching unit for matching impedances between the input connector 10 and the transmission line, and the dielectric 15 and the conductor 17 may be regarded as an impedance matching unit for matching impedances between the transmission line and the output connector 11.

In FIG. 2, reference numerals 19 and 20, not described, denote a headless holt and a bushing required to connect the center electrode 18 of the coaxial line, on which the diode stacks are assembled, to the conductor 16. In this case, the headless bolt 19 and the bushing 20 are also used to connect the center electrode 18 of the coaxial line to the conductor 17.

The above-described stacked diode limiter according to the embodiment of the present invention may also be used in the form of a hybrid limiter to which heterogeneous technologies are applied in such a way that a plasma discharge-type special limiter circuit devised to be operated at MW or more, which cannot be solved by the diode limiter, is connected to the input of the stacked diode limiter presented in the present invention.

Although the use of a diode stack structure seems to be similar to that of the conventional technology, the present invention is characterized in that, in a method of stacking diodes on the coaxial line, the diodes are arranged in on air dielectric within the coaxial line using bulk diodes, and impedance mismatch characteristics occurring between heterogeneous dielectrics in a transition procedure from the input of the N-type connector to the coaxial line are solved.

Figure 5:
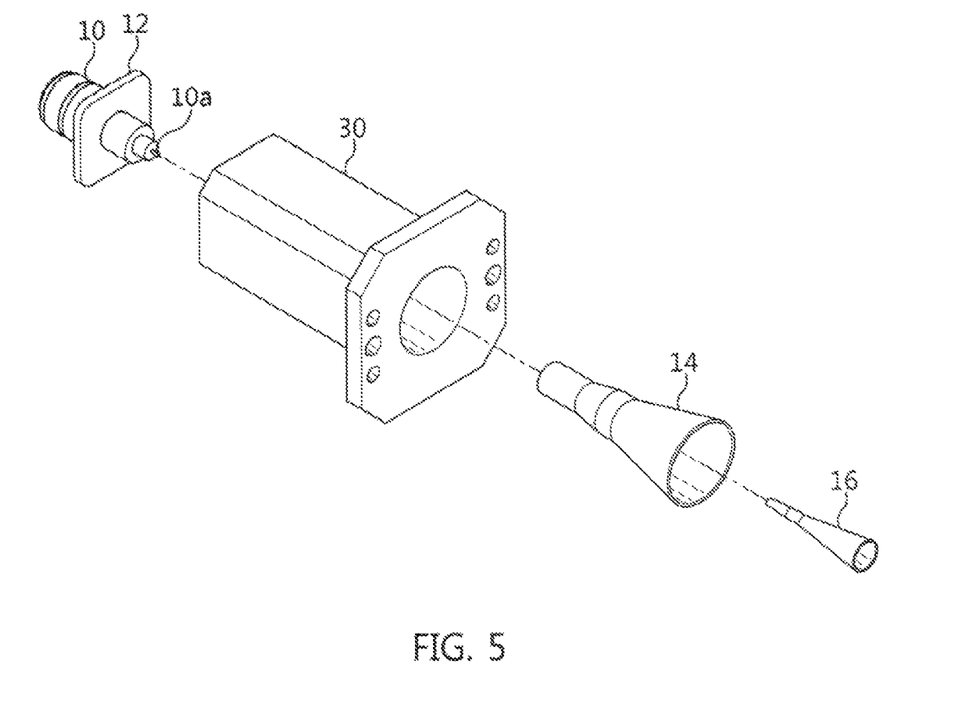
FIG. 5 is an exploded perspective view showing the impedance matching unit of the stacked diode limiter according to an embodiment of the present invention.
Figure 6:
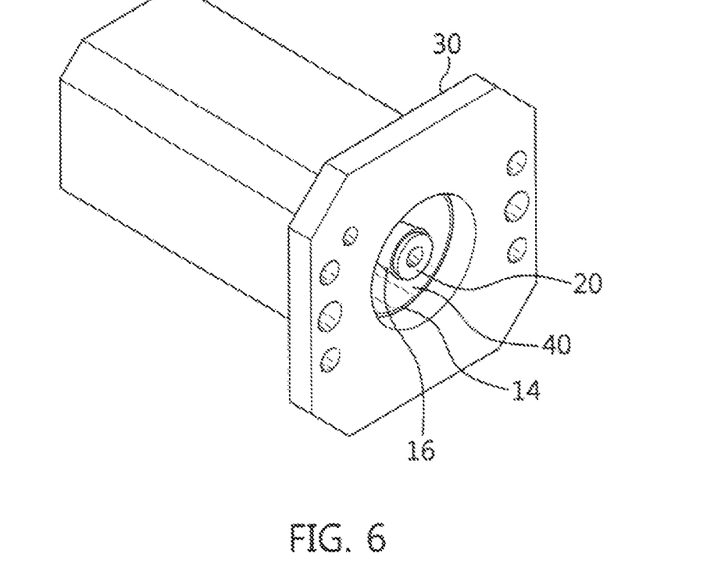
FIG. 6 is a view showing the assembled impedance matching unit of FIG. 5, which shows a state viewed from the right side of FIG. 5.
Figure 7:
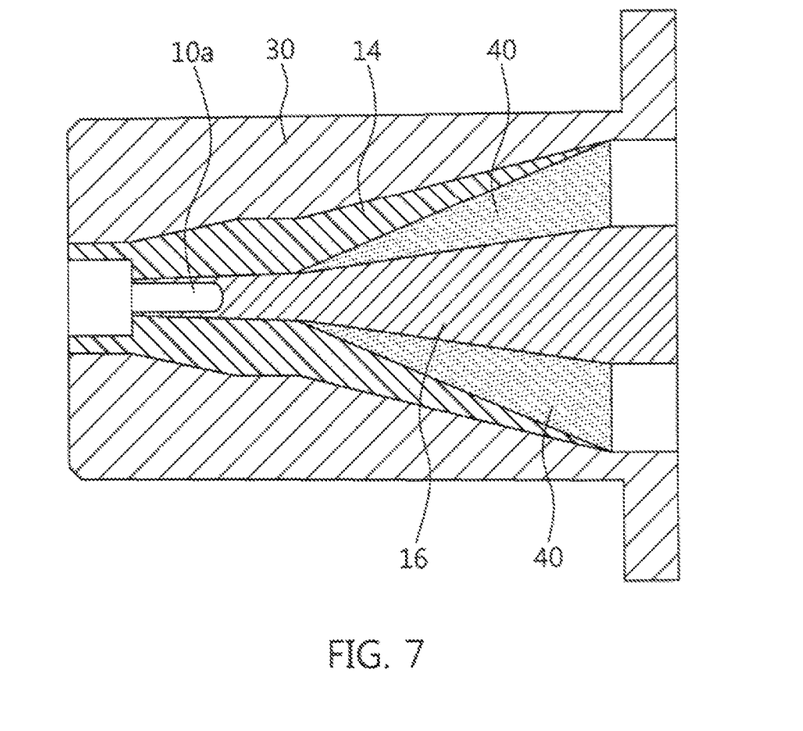
FIGS. 7 and 8 are sectional views showing the impedance matching unit of the stacked diode limiter according to an embodiment of the present invention.
Figure 8:
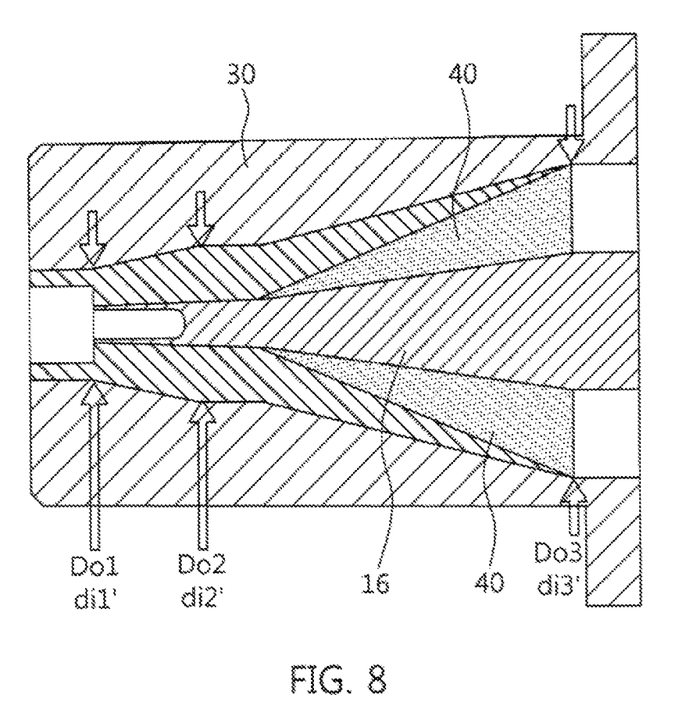

FIG. 5 is an exploded perspective view showing the impedance matching unit of the stacked diode limiter according to an embodiment of the present invention, FIG. 6 is a view showing the assembled impedance matching unit of FIG. 5, which shows a state viewed from the right side of FIG. 5, and FIGS. 7 and 8 are sectional views showing the impedance matching unit of the stacked diode limiter according to an embodiment of the present invention.

The components in FIGS. 5 to 8 may be regarded as components for describing the impedance matching unit connected to the input connector 10, and such components may also be equally applied to components required to describe the impedance matching unit connected to the output connector 11.

The dielectric 14 has a hollow and conical internal structure and a tapered structure. The dielectric 14 may be an insulator (Teflon) made of a plastic resin material having a relative dielectric constant of about 2.08. The dielectric 14 is fitted into the cavity of a housing 30 so that the outer surface of the dielectric 14 comes into close contact with the inner surface (wall) of the cavity of the housing 30. The dielectric 14 is processed to be step-tapered so as to secure electrical insulation performance. Accordingly, since the dielectric 14 of the input connector 10 irregularly overlaps the transmission line (that is, the coaxial line), to which the input connector 10 is connected, the surface length of the dielectric present on an electrical breakdown path is increased, thus preventing electrical breakdown from occurring due to high-voltage pulse signals.

The conductor 16 is inserted into the dielectric 14, and has a conical and tapered structure. One end of the conductor 16 inserted into the dielectric 14 is fitted over the center electrode 10a of the input connector 10 so that it encloses the center electrode 10a. In order for the dielectric 14 and the conductor 16 to be inserted into the housing 30, a cavity having the same shape as the external shape of the dielectric 14 is formed in the housing 30.

Meanwhile, since the inner diameter of one end of the dielectric 14 is larger than that of the outer diameter of one end of the conductor 16 by a predetermined value, the outer circumferential surface of the one end of the conductor 16 is spaced apart from the inner circumferential surface of the one end of the dielectric 14. An air layer is formed in a separation space 40 between the dielectric 14 and the conductor 16. The separation space 40 between the dielectric 14 and the conductor 16 may be regarded as a dielectric filled with air.

FIGS. 5 to 8 are diagrams showing the configuration of the impedance matching unit presented to solve the impedance mismatch characteristics between the input connector 10 and the transmission line occurring as the transmission line (for example, coaxial line) uses air as the dielectric. The impedance matching unit shown in FIGS. 5 to 8 may include a center electrode (that is, the conductor 16) so that it can enclose the center electrode 10a of the input connector 10, and may solve the problem of impedance mismatch caused by different dielectric constants of the dielectric 14 and the air dielectric (dielectric filled in the separation space 40) by designing the dielectric to have a hollow and conical internal structure by a predetermined length.

Referring to FIG. 8, it can be seen that the ratio Do1/di1 of outer diameter (Do) to inner diameter (di) required to determine the 50Ω impedance of the input connector 10 is varied, and the thickness of the dielectric 14 is reduced in proportion to the length of the dielectric 14 in a transition section ranging from the end point of the outer diameter/inner diameter (Do2/di2) to the outer diameter/inner diameter (Do3/di3) at the end of the input part. Here, the inner diameter required to determine the 50Ω impedance may refer to the outer diameter of the conductor 16, and the outer diameter required to determine the 50Ω impedance may refer to the outer diameter of the dielectric 14. Therefore, referring to FIG. 8, it can be seen that di1, di2, di3, Do1, Do2, and Do3 at the locations of respective arrows have different values.

Figure 9:
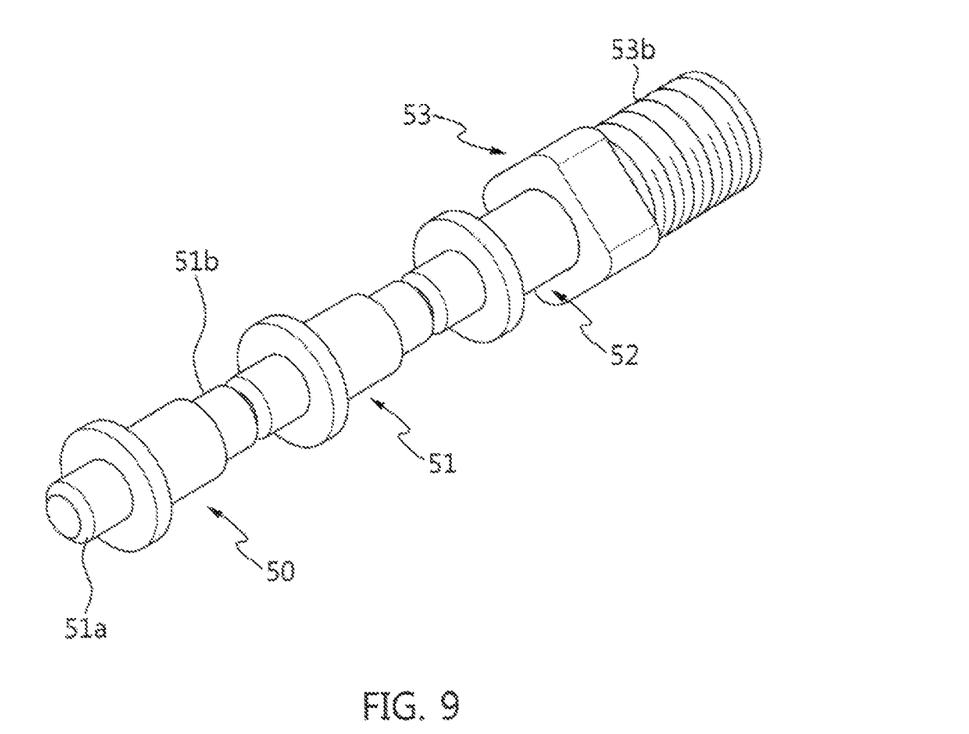
FIG. 9 is a perspective view showing any one of a plurality of diode stack parts shown in FIG. 2.

FIG. 9 is a perspective view showing in detail the diode stack part 21 shown in FIG. 2.

The diode stack part 21 is configured such that bulk diodes 50, 51, and 52 are connected in series. In this case, connection parts between the bulk diodes 50, 51, and 52 may be soldered. Of course, the diodes may be connected using conductive epoxy, instead of soldering, at the connection parts thereof. However, since conductive epoxy may be broken after being hardened, if is more effective to use a soldering method rather than an adhesive method using conductive epoxy from the standpoint of stability.

Meanwhile, when diodes stacked on the center electrode 18 of the transmission line (e.g., coaxial line) are connected, the thermal conductivity of the center electrode 18 is too high to directly connect the diodes to the center electrode 18, and thus this method is not good from the standpoint of work efficiency. In order to improve work efficiency, a separate connection part 53 is used. One end of the connection part 53 (that is, a portion connected to the center electrode 18 of the transmission line) is manufactured in the shape of a bolt, and threads 53b are formed at the end of the bolt. In correspondence with this, a threaded hole is formed in the center electrode 18 of the transmission line (for example, coaxial line), and then the diode stack part 21 is engaged with the center electrode 18 via threaded coupling between the threads 53b and the threaded hole. Even if the number of stages that are connected is increased, the diode stacks may be connected to the center electrode 18 of the coaxial line in the above manner.

In FIG. 9, reference numeral 51, not described, may denote the anode of the bulk diode 50, and reference numeral 51b, not described, may be the cathode of the bulk diode 50.

The diode stack part 21 has been described in detail with reference to FIG. 9, and other diode stack parts may be configured in a similar way. Those skilled in the art may easily understand the configuration of other diode stack parts based on FIG. 9 and the description thereof.

Figure 10:
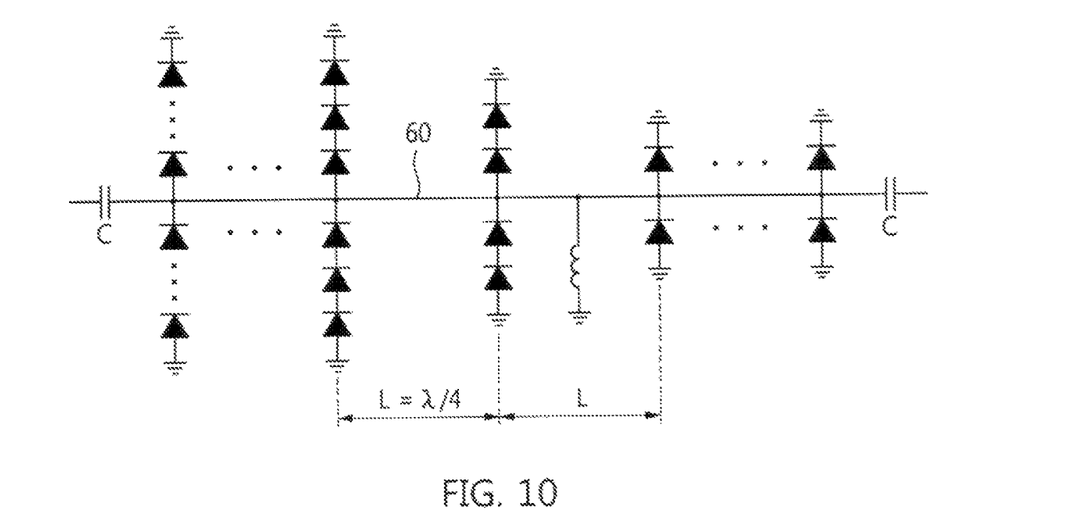
FIG. 10 is a circuit diagram showing an electrical equivalent circuit of the stacked diode limiter according to an embodiment of the present invention.

FIG. 10 is a circuit diagram showing the electrical equivalent circuit of the stacked diode limiter according to an embodiment of the present invention.

As shown in FIG. 10, individual stages of diode stacks are arranged to be electrically spaced apart from each other by a separation distance of ¼ wavelength at a design center frequency, and an inductor L is connected in parallel with a transmission line 60 so as to bypass a DC voltage occurring on the diode stages. By way of the arrangement of the diodes, a high-power input interference pulse may be suppressed or eliminated in multiple stages.

In the present invention, although a coaxial line has been exemplified to perform a high-power pulse operation at a power of several kW or more, a microstrip line, a strip line, or a coplanar waveguide (CPW) line may be used as the transmission line 60 on which diodes may be assembled at a power of kW or less. The diodes may be sequentially arranged is the sequence of power level so that power suppressing may be performed in several stages from an input terminal, and diodes having a low operating power level are used as a pair of anti-parallel diodes used in the final stage. Capacitors C arranged at the input and output of the circuit are used for DC blocking. Although not shown in the above drawings, a separate DC blocking circuit may be implemented and used at the input and output of the limiter.

Figure 11:
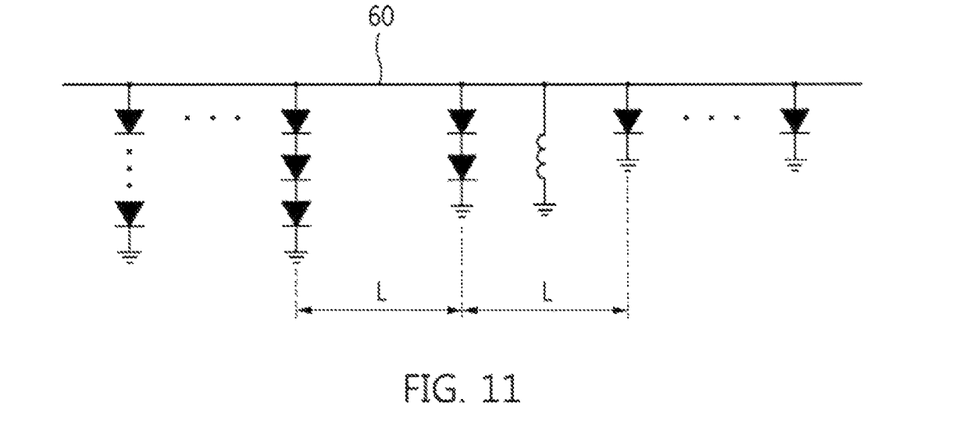
FIGS. 11 and 12 are equivalent circuit diagrams showing modifications of the stacked diode limiter according to an embodiment of the present invention.
Figure 12:
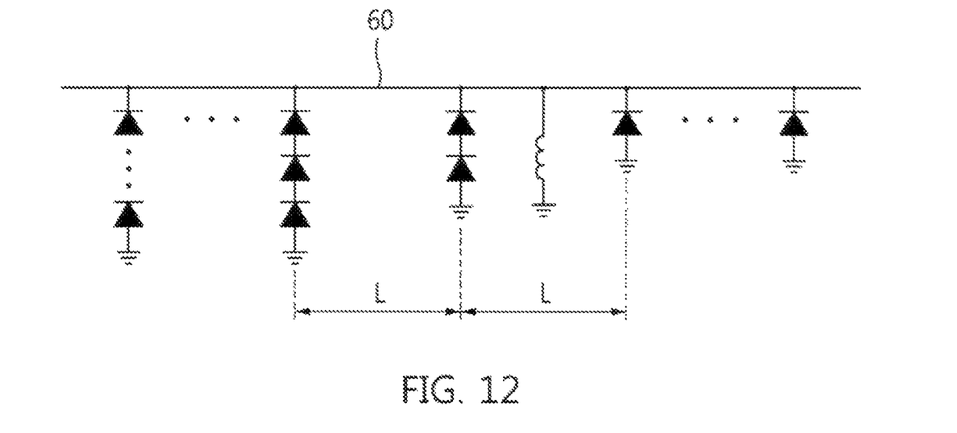

FIGS. 11 and 12 are equivalent circuit diagrams showing modifications of the stacked diode limiter according to an embodiment of the present invention.

FIGS. 11 and 12 show that a stacked diode limiter is configured in a single-ended structure other than an anti-parallel structure.

Even if the stacked diode limiter is configured in the single-ended structure in this way, it may act as a limiter. When a structure capable of performing a limiting operation on both positive and negative polarities of a sine wave is an anti-parallel structure, the single-ended structure may denote a structure for eliminating one polarity and passing the other polarity.

If the stacked diode limiter is configured in the single-ended structure, the turn-on operation of each diode is maintained even if the polarity of an input pulse is changed in the case where the switching of forward/reverse current of the diode occurs later than the frequency of the input pulse. Accordingly, only for an initial predetermined time, a pulse having the opposite polarity passes through the limiter. After the turn-on operation, a pulse having the opposite polarity may be gradually suppressed by the limiter.

However, it may be considered that the limiting performance of the single-ended structure is deteriorated compared to the anti-parallel structure.

Figure 13:
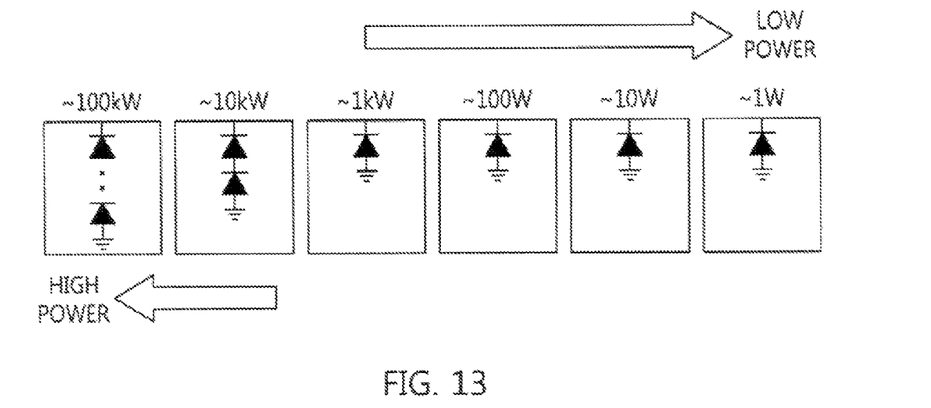
FIGS. 13 and 14 are diagrams showing the power intensities of diodes arranged for respective input power limits in the stages of the multi-stage diode structure of FIGS. 10 to 12.
Figure 14:
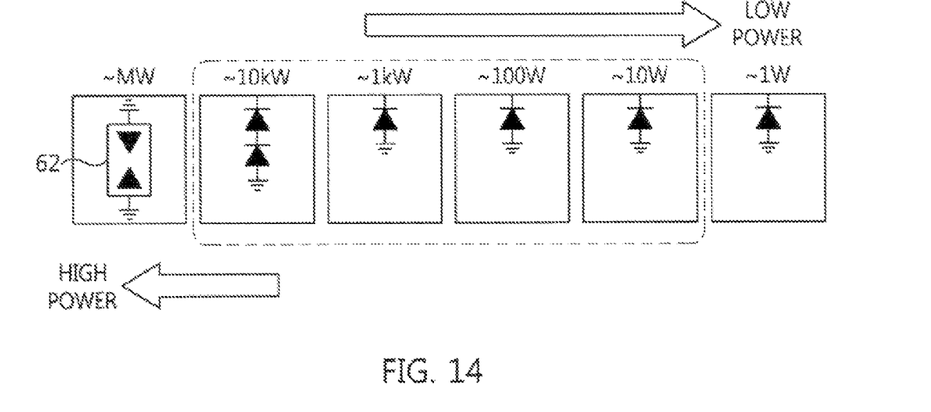

FIGS. 13 and 14 are diagrams showing the power intensities of diodes arranged for respective input power limits in the stages of the multi-stage diode structure of FIGS. 10 to 12.

FIG. 13 illustrates the connection of diodes that can be used for respective operating power sections in the arrangement of diodes. At a power of 1 kW or less, commercial PIN diodes may be used in such a way that a pair of diodes is used in an anti-parallel structure without being stacked, or a single diode may be used as a single-ended structure. At a power of 1 kW or more, a power limiting operation cannot be performed using only a single diode, and thus a stacked structure is used. The number of diodes stacked on top of one another is determined and used depending on the input power. The power limit of the stacked diode limiter is expected to be about 100 kW in consideration of performance degradation, power limits, etc. caused by floating components typically occurring in the series connection of the diodes.

Meanwhile, in order to effectively perform a power limiting operation against a high-power electromagnetic pulse (EMP) having power exceeding 10~100 kW or an Intentional Electromagnetic Interference (IEMI) signal, a high-speed plasma limiter 62 may be connected to the previous stage of the limiter and may be used, as shown in FIG. 14. The plasma limiter 62 used at this time does not designate an existing Gas Discharge Tube (GDT) or a Surge Protection Device (SPD). The reason for this is that the GDT or SPD requires a time of 100 ns or more as an initial waiting time (response time) required to perform a limiting operation. This means that, for the time of 100 ns, an electronic device at the subsequent stage of an antenna line may be exposed to a high-power electromagnetic attack source or an interference pulse and may be permanently damaged, without a protection circuit. Therefore, the plasma limiter 62 of FIG. 14 denotes a device characterized in that a plasma charge structure capable of responding to an input high-power electromagnetic pulse signal within a time of nano-seconds or less using a streamer discharge phenomenon is used.

Figure 15:
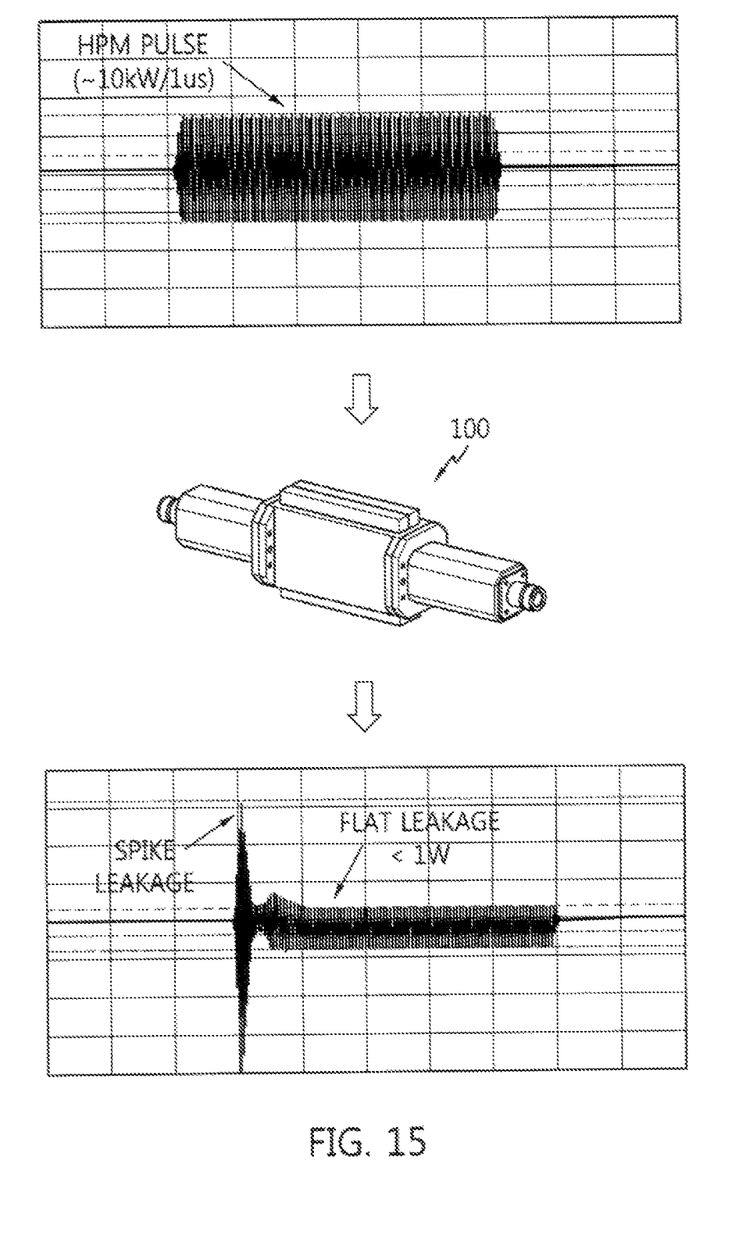
FIG. 15 is a diagram showing the high-power electromagnetic pulse suppression performance of the stacked diode limiter according to an embodiment of the present invention.
Figure 16:
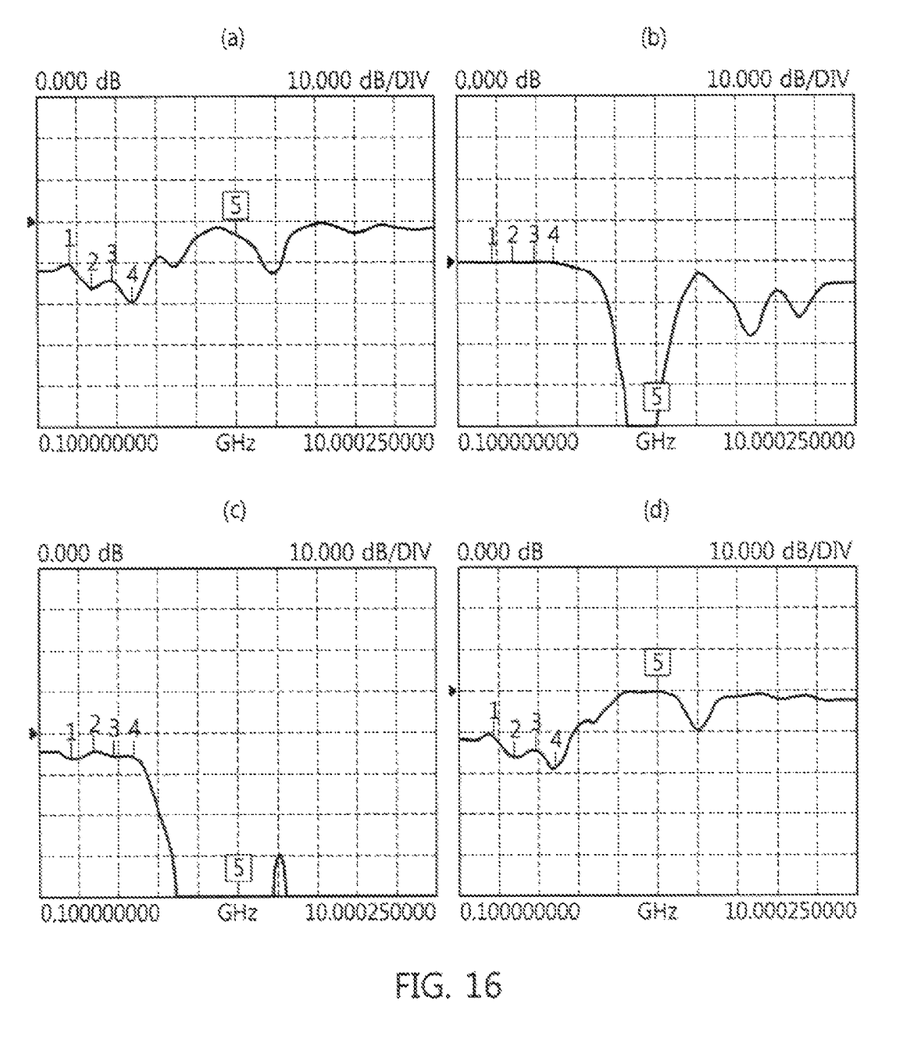
FIGS. 16A to 16D are waveform diagrams showing the small signal frequency response characteristics of the stacked diode limiter according to an embodiment of the present invention.

FIG. 15 is a diagram showing the high-power electromagnetic pulse suppression performance of the stacked diode limiter according to an embodiment of the present invention, and FIGS. 16A to 16D are waveform diagrams showing the small signal frequency response characteristics of the stacked diode limiter according to an embodiment of the present invention.

FIG. 15 is a waveform diagram showing a time domain waveform and power leakage intensity seen from the output of the stacked diode limiter 100 when a high-power pulse signal having a continuous wave (CW) frequency of 1 GHz, a duration of 1 μs, a repetition time of 100 μs, and a peak power of 10 kW is applied, as an input signal, to the stacked diode limiter 100 according to the embodiment of the present invention.

In FIG. 15, a high-power microwave (HPM) signal of 10 kW is an example of the high-power pulse signal. Even if an interference signal having a power intensity of more than 10 kW is input, signal level performance below the output power leakage of FIG. 15 may be exhibited if the number of diodes to be stacked in the first stage-section (that is, a diode stack part arranged closest to the input connector) of the stacked diode limiter 100 is designated in correspondence with the intensity of the input interference signal.

In the case of the suppression level of an input signal versus an output signal, suppression performance is nonlinearly improved depending on the number of stages in which diodes are arranged (that is, it means that suppression performance is not linearly improved depending on the number of added stages), but the small signal insertion loss of the limiter is increased as the number of stages is increased. Accordingly, the number of stages is determined in consideration of both the improvement of suppression performance and the attenuation of normal signals.

That is, as shown in FIG. 15, when a pulse-modulated high-power microwave pulse (HPM) having a frequency of 1 GHz and a power of 10 kW is injected as input, it can be seen that a residual power performance of 1 W or less may be obtained. It can be seen in FIGS. 16A to 16D that performance of DC −2.5 GHz may be exhibited as an operating frequency.

The stacked diode limiter according to the embodiment of the present invention is a device which must satisfy both small-signal S-parameter network performance and large signal suppression characteristics presented in FIGS. 16A to 16D.

In other words, the stacked diode limiter according to the embodiment of the present invention is a nonlinear device which must less influence a noise index when connecting to the antenna line, system reception sensitivity, etc. because it has an insertion loss of 1 dB or less at a small signal, whereas must function as an attenuator because insertion loss is greatly increased if a high-power signal is input and a limiting operation is performed. Therefore, as insertion loss and reflection loss at small signals become lower, performance becomes excellent, whereas as insertion loss at large signals becomes higher, suppression performance becomes excellent.

The above-described present invention may be considered to have the following configuration characteristics. 1) N-type connectors are used as input/output connectors, and the Teflon dielectric of each N-type connector is processed to be step-tapered and irregularly overlaps a coaxial line to which the N-type connector is connected, thus securing electrical insulation performance. 2) In order to solve the problem of impedance mismatch occurring between the Teflon dielectric of the N-type connector and the air of the coaxial line, the present invention is characterized by a structure for performing impedance matching between the N-type connector and the coaxial line filled with air using a method of uniformly reducing thickness using a Teflon material. 3) In order to overcome the input power limit of a single diode, the present invention is characterized by a structure for stacking diodes in series and extending input power limit by the number of equivalently stacked diodes. 4) In order to suppress or eliminate a high-power pulse interference signal input to an in-band communication frequency band over multiple stages, the present invention is characterized by a structure in which different numbers of diodes to be stacked, having different input power limits, are periodically arranged at intervals of a predetermined length (¼ wavelength) calculated depending on the frequency. 5) In consideration of the case where the number of diode stacks connected to the center electrode in parallel increases in the structure of the coaxial line forming the limiter, and the length of the center electrode becomes larger than the size of the internal space of the coaxial line, and then the diode stacks must be led in the external ground metal of the coaxial line, a separation distance to the diodes or the size of a hollow portion must be determined not to deteriorate the frequency response characteristics of the coaxial hue and must be used, upon forming the hollow portion is the external ground metal of the coaxial line.

In accordance with the present invention having the above configuration, an electronic device and elements on an antenna line may be safely protected against a high-power electromagnetic pulse (EMP) and an Intentional Electromagnetic Interference (IEMI) having a peak power of several kW to several tens of kW or more and having a frequency component of several GHz or less.

That is, the present invention may solve the problem of both a power level (ranging to several tens of kW) and an operating frequency (ranging to several GHz) that cannot be simultaneously satisfied using conventional technology.

As described above, optimal embodiments of the present invention have been disclosed in the drawings and the specification. Although specific terms have been used in the present specification, these are merely intended to describe the present invention and are not intended to limit the meanings thereof or the scope of the present invention described in the accompanying claims. Therefore, those skilled in the art will appreciate that various modifications and other equivalent embodiments are possible from the embodiments. Therefore, the technical scope of the present invention should be defined by the technical spirit of the claims.

What is claimed is:

1. A stacked diode limiter comprising:
   a stacked diode unit including one or more diode stack parts formed on a center electrode of a coaxial line formed between an input connector and an output connector, each diode stack part being configured such that a plurality of diodes are arranged in series and stacked on top of one another; and
   an impedance matching unit for configuring dielectrics between the connectors and the coaxial line as heterogeneous dielectrics and matching impedances between the connectors and the coaxial line.

2. The stacked diode limiter of claim 1, wherein the stacked diode unit comprises:
   a first diode stack part having two or more diodes staked on top of one another in series and formed on the center electrode of the coaxial line in an anti-parallel connection structure; and
   a second diode stack part having a single diode formed on the center electrode of the coaxial line to form an anti-parallel connection structure together with an opposite diode.

3. The stacked diode limiter of claim 2, wherein:
   operating power limits of the first diode stack part and the second diode stack part are different from each other, and one of the first diode stack part and the second diode stack part, which has a higher operating power limit is arranged closer to the input connector.

4. The stacked diode limiter of claim 2, wherein the first diode stack part and the second diode stack part are arranged to be spaced apart from each other by a ¼ wavelength.

5. The stacked diode limiter of claim 1, wherein the stacked diode unit comprises:
a first diode stack part m which two or more diodes are stacked on top of one another in series and formed on the center electrode of the coaxial line in a single-ended connection structure; and
a second diode stack part in which a single diode is formed on the center electrode of the coaxial line in a single-ended connection structure.

6. The stacked diode limiter of claim 5, wherein:
operating power limits of the first diode stack part and the second diode stack part are different from each other, and
one of the first diode stack part and the second diode stack part, which has a higher operating power limit, is arranged closer to the input connector.

7. The stacked diode limiter of claim 5, wherein the first diode stack part and the second diode stack part are arranged to be spaced apart from each other by a ¼ wavelength.

8. The stacked diode limiter of claim 1, wherein:
the plurality of diodes are connected via soldering or conductive epoxy,
each diode stack part is soldered at a second end of a connection part having threads formed at a first end thereof, and a threaded hole corresponding to the threads is formed in the center electrode of the coaxial line, and
the diode stack part is formed on the center electrode of the coaxial line via threaded coupling between the threads and the threaded hole.

9. The stacked diode limiter of claim 1, wherein the plurality of diodes are implemented as PIN diodes.

10. The stacked diode limiter of claim 1, wherein the center electrode of the coaxial line on which the stacked diode unit is formed is protected by a housing, the stacked diode unit and the center electrode of the coaxial line are installed in a longitudinal hollow portion formed in the housing, and a first end of each diode stack part of the stacked diode unit comes into contact with the housing.

11. The stacked diode limiter of claim 1, wherein:
the impedance matching unit comprises a dielectric having a hollow and conical internal structure and a tapered structure; and a conductor inserted into the dielectric and configured to have a conical and tapered structure, wherein an outer circumferential surface of a first end of the conductor is spaced apart from an inner circumferential surface of the dielectric,
an air layer is formed in a separation space between the dielectric and the conductor, and
first ends of the dielectric and the conductor are connected to the input connector.

12. The stacked diode limiter of claim 11, wherein the first ends of the dielectric and the conductor are connected to the input connector to enclose a center electrode of the input connector.

13. The stacked diode limiter of claim 1, further comprising an inductor for bypassing a direct current (DC) voltage generated at both ends of each diode stack part when a power limiting operation is performed by the stacked diode unit.

* * * * *